(12) United States Patent
Shimizu et al.

(10) Patent No.: US 6,211,537 B1
(45) Date of Patent: *Apr. 3, 2001

(54) LED ARRAY

(75) Inventors: Takatoku Shimizu; Mitsuhiko Ogihara; Masumi Taninaka; Hiroshi Hamano, all of Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/040,450

(22) Filed: Mar. 18, 1998

(30) Foreign Application Priority Data

Apr. 15, 1997 (JP) .................................................... 9-096281

(51) Int. Cl.[7] ..................................................... H01L 33/00
(52) U.S. Cl. .............................. 257/88; 257/89; 257/90; 257/91; 257/92; 257/99; 257/100; 257/640; 257/651; 257/639
(58) Field of Search ................................... 257/88, 89, 90, 257/91, 92, 99, 100, 640, 651, 639

(56) References Cited

U.S. PATENT DOCUMENTS

| 4,145,707 | 3/1979 | Sadamasa et al. . |
| 5,523,590 | * 6/1996 | Ogihara et al. ........................ 257/88 |

FOREIGN PATENT DOCUMENTS

| 0 723 285 | 7/1996 | (EP) . |
| 0 776 047 | 5/1997 | (EP) . |
| 62-60053 | 4/1987 | (JP) . |
| 5-95134 | 4/1993 | (JP) . |
| 07122781 | 5/1995 | (JP) . |
| 7-122781 | 5/1995 | (JP) . |
| 08330634 | * 12/1996 | (JP) ................................ H01L/33/00 |

OTHER PUBLICATIONS

Ogihara, Mitsuhiko et al., "1200 DPI Light Emitting Diode Array for Optical Printer Print Heads," Extended Abstracts of the 1996 International Converence on Solid State Devices and Materials, 1996 pp. 604–606.*

"1200 DPI Light Emitting Diode Array for Optical Printer Print Heads" Ogihara et al. Extended Abstracts of the 1996 International Conference on Solid State Devices and Materials, pp. 604–606, 1996.

* cited by examiner

Primary Examiner—Carl Whitehead, Jr.
Assistant Examiner—Matthew E. Warren
(74) Attorney, Agent, or Firm—Venable; Robert J. Frank; Michael A. Sartori

(57) ABSTRACT

A 1200 dpi LED may be manufactured without highly accurate mask alignment and provide good light radiation efficiency. A first interlayer dielectric is formed on a semiconductor substrate and has a plurality of first windows formed therein and aligned in a row. A diffusion region is formed in the semiconductor substrate through each of the first windows. An electrode is formed to have an area in contact with the corresponding diffusion region. Another electrode is formed on the other side of the substrate. A second interlayer dielectric is formed on the first interlayer dielectric such that the second interlayer dielectric does not overlap the area of the electrode and does not extend to a first perimeter of the area.

14 Claims, 6 Drawing Sheets

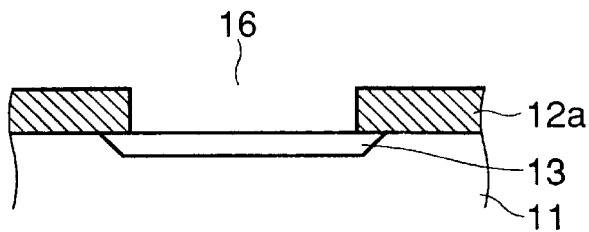
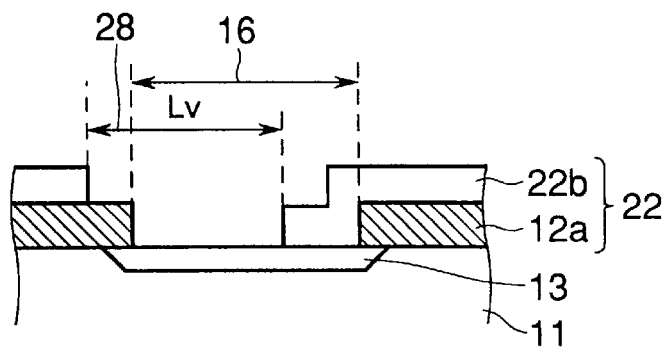
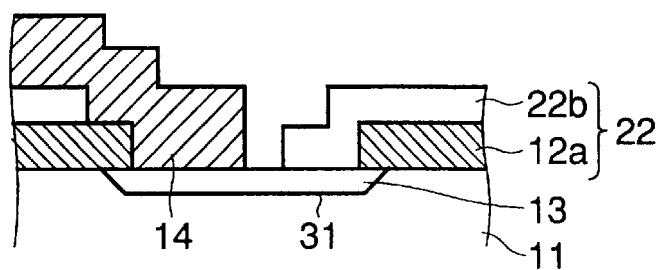
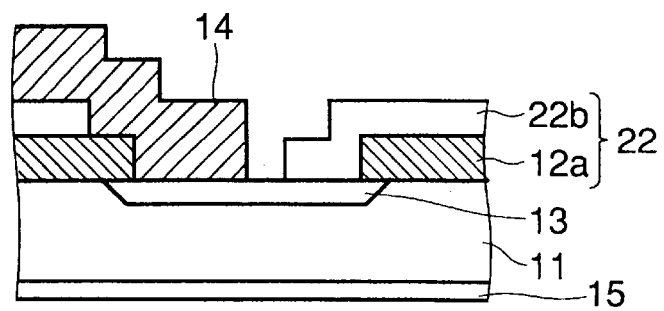

LED ARRAY

BACKGROUND OF THE INVENTION

1. Field of the Invention

This invention relates to LED arrays for use in an exposure light source (printer head) for an electrophotographic printer, and more particularly to highly integrated LED arrays with a density or resolution higher than 1200 DPI (Dot Per Inch).

2. Description of Related Art

Japanese Utility Model Preliminary Publication (KOKAI) No. 62-60053 discloses one such conventional LED array as a light source for use in an electrophotographic printer. FIGS. 6A–6B illustrate the construction of the conventional LED array 4, FIG. 6A being a top view of the LED array 4 and FIG. 6B being a cross-sectional view taken along lines 6B—6B of FIG. 6A.

As shown in FIGS. 6A–6B, the LED array 4 includes a plurality of LEDs 40 aligned in a row on an n-type semiconductor substrate 41. Each of the LEDs 40 includes a first interlayer dielectric 42a, first window 46 formed in the first interlayer dielectric 42a, second interlayer dielectric 42b, second window 48 formed in the second interlayer dielectric 42b, p-type diffusion region 43, p-electrode 44, and n-electrode 45.

The second window 48 is in alignment with the first window 46 and is of the same size as or slightly larger than the first window 46. In other words, the first window 46 is within the second window 48. The p-type diffusion region 43 is formed in the n-type semiconductor substrate immediately below the first window 46. The p-electrode 44 extends into the first window 46 and contacts the p-type diffusion region 43. The n-electrode 45 is common to all of the LEDs 40 and is formed on the reverse side of the n-type semiconductor substrate 41.

The p-type diffusion region 43 and n-type semiconductor substrate 41 constitute a pn junction 51 which emits light when energized. The p-electrode 44 is formed to cover the p-type diffusion region 43 both at a part 47a of the diffusion region surface 47 and at a part 46a of the first window 46. When a current flows between the p-electrode 44 and the n-electrode 45, the pn junction 51 emits light which emanates from a light-emitting area 47b not covered with the p-electrode 44.

Using the first interlayer dielectric 42a as a selective diffusion mask, zinc which is a p-type impurity is diffused from the first window 46 into the n-type semiconductor substrate 41, forming the diffusion region 43. The second interlayer dielectric 42b is formed in order to ensure the insulation between the p-electrode 44 and the n-type semiconductor substrate 41 even when pin holes are developed in the first interlayer dielectric 42a. Forming the second interlayer dielectric 42b on the first interlayer dielectric 42a improves the yield of the LED array 4.

With the aforementioned conventional LED array 4, if the LED array 4 is to have a ultra-high density higher than 1200 DPI, then the first windows 46 must be very small and arranged at very small intervals accordingly. Correspondingly, the second windows 48 must also be very small. Therefore, the mask must be registered with high accuracy during the photolithography process for forming the second windows 48 regardless of whether the second windows 48 are of the same size as or larger than the first windows 460. If the first windows 46 are partly outside of the second windows 48 due to poor alignment accuracy, the p-electrode 44 may have a smaller area in contact with the p-type diffusion region 43, that is, the area of the part 46a decreases. A decrease in the area of the part 46a increases contact resistance, resulting in poor characteristics and therefore lower yield of the LED arrays.

SUMMARY OF THE INVENTION

The present invention is to solve the aforementioned problems of the conventional LED arrays.

An object of the present invention is to provide highly integrated LED arrays with good yield of the LED arrays.

Another object of the present invention is to provide LED arrays with high radiation efficiency of light.

A first interlayer dielectric is formed on a semiconductor substrate of a first conductivity type. The first interlayer dielectric has a plurality of first windows formed therein and aligned in a row. A second interlayer dielectric is formed on the first interlayer dielectric. A diffusion region of a second conductivity type is formed in the semiconductor substrate through each of the first windows. An electrode is formed and has an area in contact with the diffusion region. The second interlayer dielectric is formed such that the second interlayer dielectric does not overlap an area of the electrode in contact with the diffusion region and does not extend to a first perimeter of the area.

The second interlayer has a second window with a second perimeter and the first windows are within the second window and do not extend to the second perimeter.

The second interlayer may be formed to cover each of the first windows except for an area of the electrode in contact with the diffusion region. The second interlayer dielectric is formed of a material transparent to light and has a refractive index larger than 1.9 so that light emanates through the second interlayer dielectric efficiently.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative regarding the present invention, and wherein:

FIGS. 4A–4D illustrate sample processes for fabricating the LED array of the second embodiment;

DETAILED DESCRIPTION OF THE INVENTION

Although preferred embodiments will be described with reference to an LED array having LEDs aligned at intervals corresponding to 1200 DPI, the invention is also applicable to an LED array having LEDs aligned at intervals corresponding to a resolution higher than 1200 DPI, for example, 2400 DPI.

First Embodiment

Figure 1A:
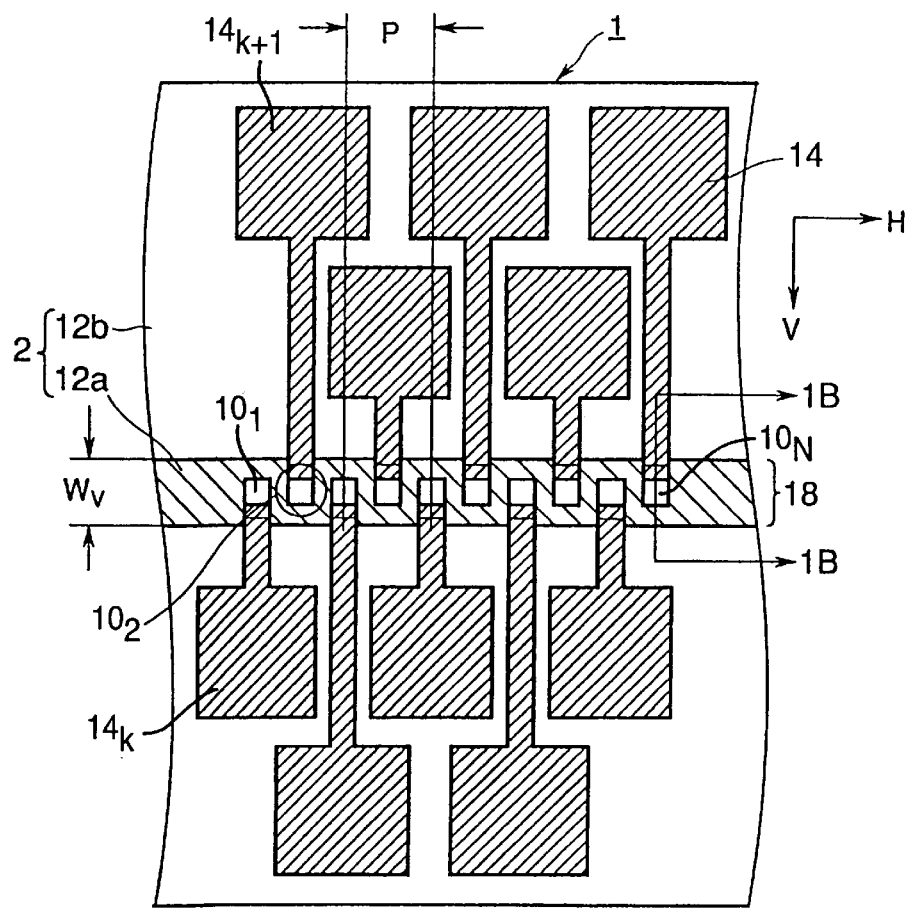
FIGS. 1A–1B illustrate a structure of an LED array according to a first embodiment of the invention, FIG. 1A being a top plan view and FIG. 1B being a cross-sectional view taken along lines 1B—1B of FIG. 1A.
Figure 1B:
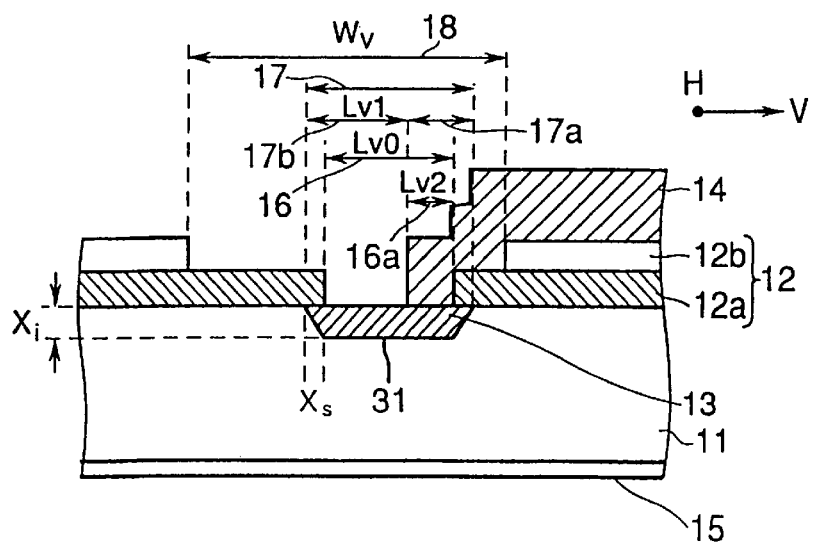

FIGS. 1A–1B illustrate a structure of an LED array according to a first embodiment of the invention, FIG. 1A being a top plan view and FIG. 1B being a cross-sectional view taken along lines 1B—1B of FIG. 1A. The LED array 1 shown in FIGS. 1A–1B has a density of 1200 DPI. The LED array 1 includes N LEDs, i.e., LEDs $10_1$ to $10_N$ arranged at intervals corresponding to 1200 DPI on an n-type semiconductor substrate 11.

The LED array 1 includes an n-type semiconductor substrate 11 on which the LEDs $10_1$ to $10_N$ are aligned in a row. A first interlayer dielectric 12a has a row or first windows 16 formed therein. An LED element will be formed in each of the first windows. A second interlayer dielectric 12b has a second window 18 formed therein. A p-type diffusion region 13 is Formed in the n-type semiconductor substrate 11 immediately below the first window 16 and a p-electrode 14 is formed for each LED. The LEDs $10_1$ to $10_N$ share a common n-electrode 15. The first interlayer dielectric 12a and the second interlayer dielectric 12b form an interlayer dielectric 12 in the form of a laminated layer structure. The N first windows 16, and therefore the N p-type diffusion regions 13 are arranged at predetermined intervals on the semiconductor substrate 11. The p-electrode 14 is formed on the second interlayer dielectric 12b and in the first window 16. The p-electrode 14 has an area in contact with the p-type diffusion region 13 in the first window 16. As shown in FIG. 1A, the electrodes 14 of the LEDs 10 are arranged such that a k-th p-electrode $14_k$ extends laterally on one side of the row of LEDs and a (k+1)-th p-electrode $14_{k+1}$ is on the other. The n-electrode 15 is formed on the entirety of the reverse surface of the n-type semiconductor substrate 11. The second window 18 is a hole elongated in a direction in which the first window are aligned so that the row of the first windows is within the elongated hole and does not extend to the perimeter of the second window 18.

The manufacturing processes of the LED array 1 will now be described with reference to FIGS. 2A–2F.

FIGS. 2A–2F show an example of manufacturing processes of the LED array 1. In the processes shown in FIGS. 2A–2F, the p-type diffusion region 13 is formed by Zn solid phase diffusion.

Figure 2A:
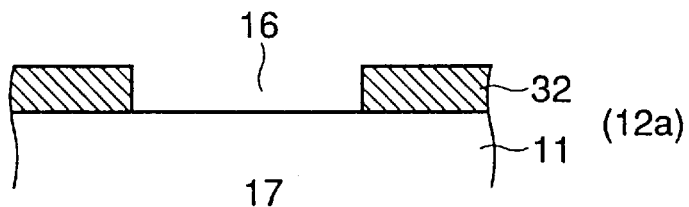
FIGS. 2A–2F show sample manufacturing processes of the LED array of the first embodiment.

First, as shown in FIG. 2A, the first interlayer dielectric 12a is formed on the surface of the n-type semiconductor substrate 11. Then, the first interlayer dielectric 12a is patterned to form the first windows 16 and the selective diffusion mask 32. Upon forming the selective diffusion mask 32, the n-type semiconductor substrate 11 is exposed through the first windows 16. The n-type semiconductor substrate 11 is, for example, a GaAs substrate which is a substrate on which an n-type GaAsP epitaxial layer has been formed. The first interlayer dielectric 12a (selective diffusion mask 32) is, for example, a film of aluminum nitride (AlN). The AlN film is formed by sputtering and has a thickness of about 2000 angstroms.

Figure 2B:
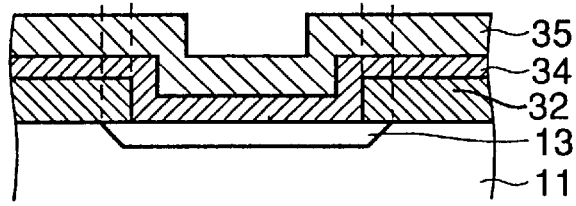

Then, as shown in FIG. 2B, a Zn diffusion source layer 34 is formed on the surface of the n-type semiconductor substrate 11 on which the diffusion mask 32 has been formed, and subsequently an annealing cap 35 is formed on the Zn diffusion source layer 34. The Zn diffusion source layer 34 is, for example, a mixture of ZnO and $SiO_2$. The $ZnO$—$SiO_2$ film is a mixture of 100 parts of zinc oxide (ZnO) and 100 parts of silicon dioxide ($SiO_2$) and is formed by sputtering. The annealing cap 35 is, for example, a silicon nitride (SiN). The $ZnO$—$SiO_2$ mixture has a thickness of about 1000 angstroms and the SiN film has a thickness of about 1000 angstroms.

After the annealing cap 35 has been formed, the n-type semiconductor substrate 11 is subjected to a high temperature annealing, so that zinc diffuses from the Zn diffusion source layer 34 into the n-type semiconductor substrate 11. The zinc diffuses into the n-type semiconductor substrate 11 through the first windows 16 but does not penetrate the selective diffusion mask 32 though zinc also spreads laterally through the first windows 16 into the substrate 11 to some extent depending on the diffusion depth. Therefore, a p-type diffusion region 13 is formed only through the first windows 16 into the n-type semiconductor substrate 11. The high temperature annealing is performed, for example, at a temperature of 700° C. for two hours. These annealing conditions yield the p-type diffusion region 13 of a diffusion depth of $X_j$=1 micron, a surface density of Zn of $10^{20}$ $cm^{-3}$, and a lateral diffusion of $X_s$=1.5 microns. Use of the Zn solid phase diffusion allows formation of the p-type diffusion region 13 having a shallow diffusion depth and low sheet resistance (Zn density is high in the surface) and therefore yielding LEDs 10 with a high light-emitting efficiency. The annealing cap 35 prevents Zn from diffusing in the annealing atmosphere. In the specification, the surface of the p-type diffusion region 13 which is also a part of the surface of the semiconductor substrate 11 is referred to as a diffusion region surface 17. As mentioned above, zinc diffuses not only vertically but also laterally into the semiconductor substrate 11, resulting in the diffusion region surface 17 having a larger area than the first window 16.

Figure 2C:
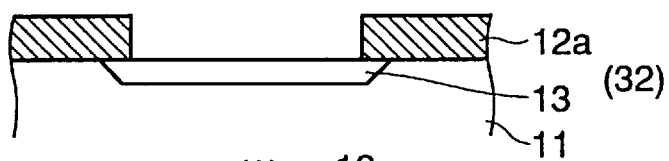

As shown in FIG. 2C, after the p-type diffusion region 13 has been formed in the n-type semiconductor substrate 11, the diffusion source layer ($ZnO$—$SiO_2$ mixture) 34 and the annealing cap 35 (SiN) are removed by a wet etching solution such as buffered hydrofluoric acid which will not attack the first interlayer dielectric 12a (AlN).

Figure 2D:
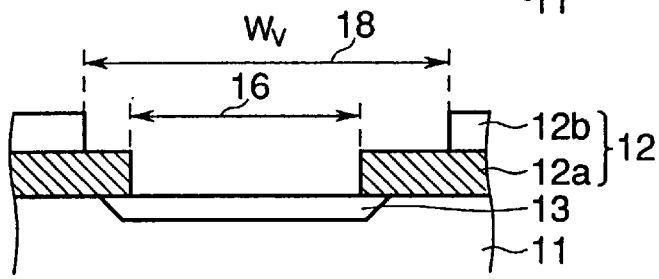

As shown in FIG. 2D, after the diffusion source layer 34 and the annealing cap 35 have been removed from the n-type semiconductor substrate 11, the second interlayer dielectric 12b is formed on the surface of the n-type semiconductor substrate 11. The second interlayer dielectric 12b is then patterned by photolithography and etching to form the second window 18 in the second interlayer dielectric 12b. The second interlayer dielectric 12b takes the form of, for example, a silicon nitride (SiN) formed by CVD. The SiN film has a thickness of about 1000 angstroms. The second interlayer dielectric 12b is wet-etched using, for example, buffered hydrofluoric acid which does not attack the first interlayer dielectric 12a (AlN). The laminated structure of the first interlayer dielectric 12a and the second interlayer dielectric 12b forms an interlayer dielectric 12 in areas except for the second window 18 which have been left unetched.

The second window 18 is in the direction H of the row of the LEDs 10 and completely accommodates N first windows 16 formed on the LED array 1. Thus, the first windows 16 are completely exposed when the second window 18 is formed. The width Wv of the second window 18 is selected such that the first windows 16 are completely exposed through the second window 18 even if the masks are misaligned during the photolithography process to some extent in the V direction, the V direction being perpendicular to the H direction in which the row of LEDs 10 extend.

Figure 2E:
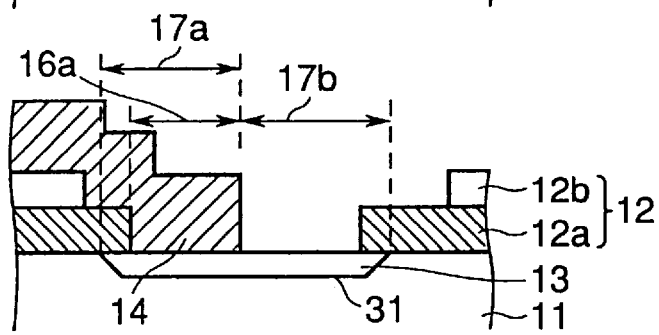

After the second window 18 has been formed, a conductive layer is formed on the n-type semiconductor substrate 11. The conductive layer is an aluminum layer which can form ohmic contact with the p-type diffusion regions 13. The conductive layer is then patterned into the p-electrodes 14 as shown in FIG. 2E. Each p-electrode 14 is formed such that a part of the p-electrode which is inside of a first window 16 is in contact with a diffusion region surface 17. Each p-electrode 14 is in ohmic contact with the p-type diffusion region 13 in a first window 16.

In this specification, an area in a first window 16 in which the p-electrode 14 contacts the p-type diffusion region 13 is referred to as a connection 16a. Likewise, an area on the diffusion region surface 17 covered with the p-electrode 14 is referred to as a blocking area 17a, and an area on the diffusion region surface 17 not covered with the p-electrode 14 is referred to as a light-emitting area 17b. When the LED 10 is energized, light is emitted at an interface 31 between the p-type diffusion region 13 and n-type semiconductor substrate 11. The light emanates from the light emitting area 17b but not from the blocking area 17a. The blocking area 17a blocks the light. The interlayer dielectric 12 is transparent to light.

Figure 2F:
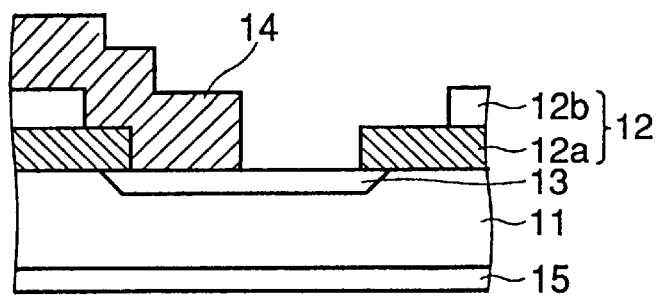

Then, the reverse side of the n-type semiconductor substrate 11 is polished, and a conductive layer is formed on the entirety of the reverse side of the substrate 11 as shown in FIG. 2F. This conductive layer serves as n-electrode 15. The n-electrode 15 is, for example, a gold alloy formed by the sputtering. Upon having performed the aforementioned processes, the manufacture of the LED array 1 completes.

Various dimensions of the LED array 1 and LED 10 will now be described.

For a 1200 DPI LED array, the LEDs 10 are arranged at about 21-μm intervals on the semiconductor substrate 11. The dimensions of the first window 16 are selected such that adjacent p-type diffusion regions $13_k$ and $13_{k+1}$ are sufficiently isolated. For example, the first window 16 has a dimension Wh0 (not shown) of about 5 μm in the H direction and a dimension Lv0 of about 10 μm in the V direction.

The dimensions of the second window 18 are selected to just large enough to completely expose the first windows 16 even if the masks are misaligned to some extent during the photolithography process. The LED array 1 has N LEDs 10, aligned such that light-emitting areas 17b are accurately in line. The dimension $X_s$ of lateral diffusion of the diffusion region 13 is about 1.5 μm. The light-emitting area 17b has a dimension Wh1, not shown, of about 8 μm in the H direction. The dimension of the light-emitting area 17b or Lv1 in the V direction is about 8 μm so that the light-emitting area is substantially square. Thus, the dimension Lv2 of the connection 16a in the V direction is about 3.5 μm. The dimension Wv of the second window 18 may be selected such that the dimension Wv is long enough to accommodate the dimension Lv1+2Lv2 with a margin $L_M$ just enough to accommodate mask alignment errors in the V direction. Thus, the dimension Wv is, for example, 25 μm, which accommodates a mask alignment error of ±5 μm. Because the second window 18' extends in the H direction and accommodates N first windows 16 therein, even when the masks are misaligned in the H direction during the formation of the second window 18, the connections 16a are not covered with the second interlayer dielectric 12b. This eliminates the need for alignment of masks with high accuracy during the photolithography process for forming the second window 18, and therefore increases the yield of the LED array.

Figure 6A:
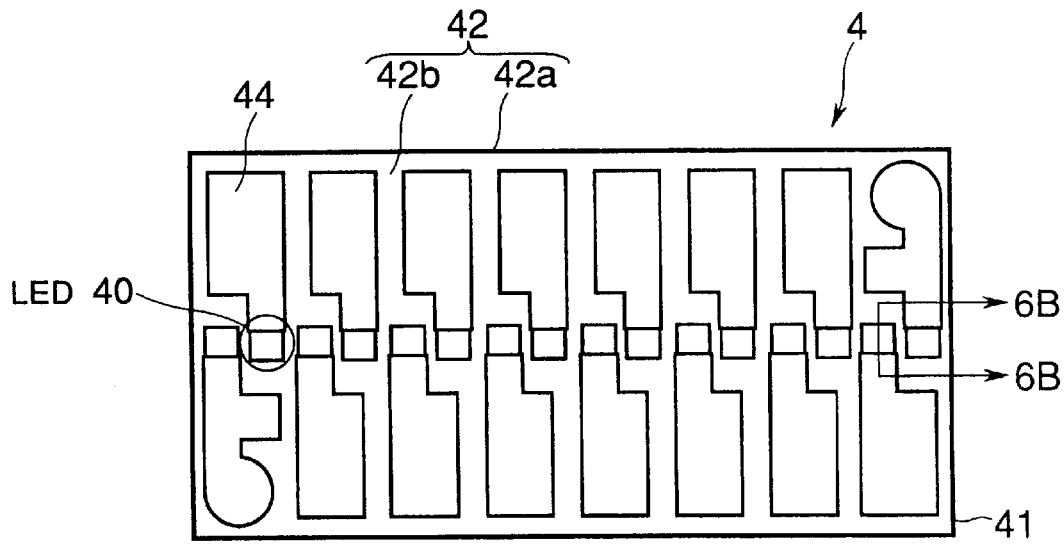
FIGS. 6A–6B illustrate the construction of the conventional LED array 4, FIG. 6A being a top view of the LED array 4 and FIG. 6B being a cross-sectional view taken along Lines 6B—6B of FIG. 6A.
Figure 6B:
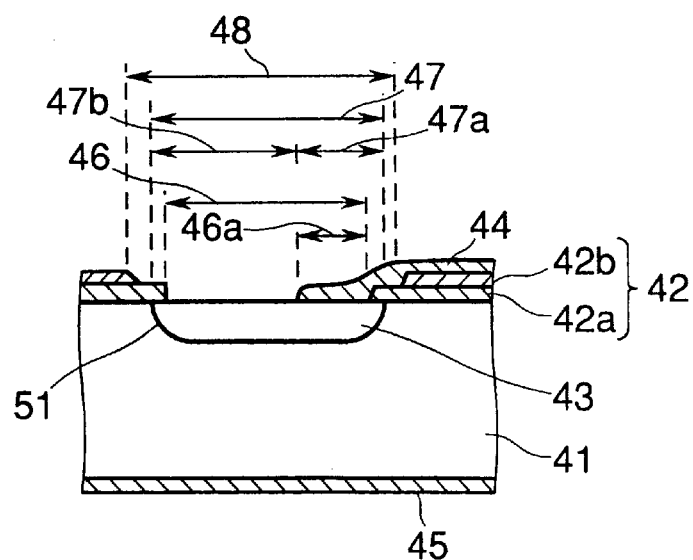

The second interlayer dielectric 12b is used to ensure isolation between the p-electrode 14 and the n-type semiconductor substrate 11 even when pin holes are developed in the first interlayer dielectric 12a. Forming the single, elongated second window 18' in the second interlayer dielectric 12b causes a larger area of the first interlayer dielectric 12a to be exposed than when the second windows are formed for individual first windows as shown in FIGS. 6A–6B. However, this exposed area is negligibly small as compared to the total surface area of the LED array 1. Therefore, the provision of the elongated second window 18' does not substantially impair the isolation effect of the second interlayer dielectric 18.

The shape of the second window 18' need not be an elongated rectangle nor does it need to be formed to completely expose the first windows 16. In other words, the second window 18 may be of any shape provided the connections 16a are completely exposed.

Second Embodiment

Figure 3A:
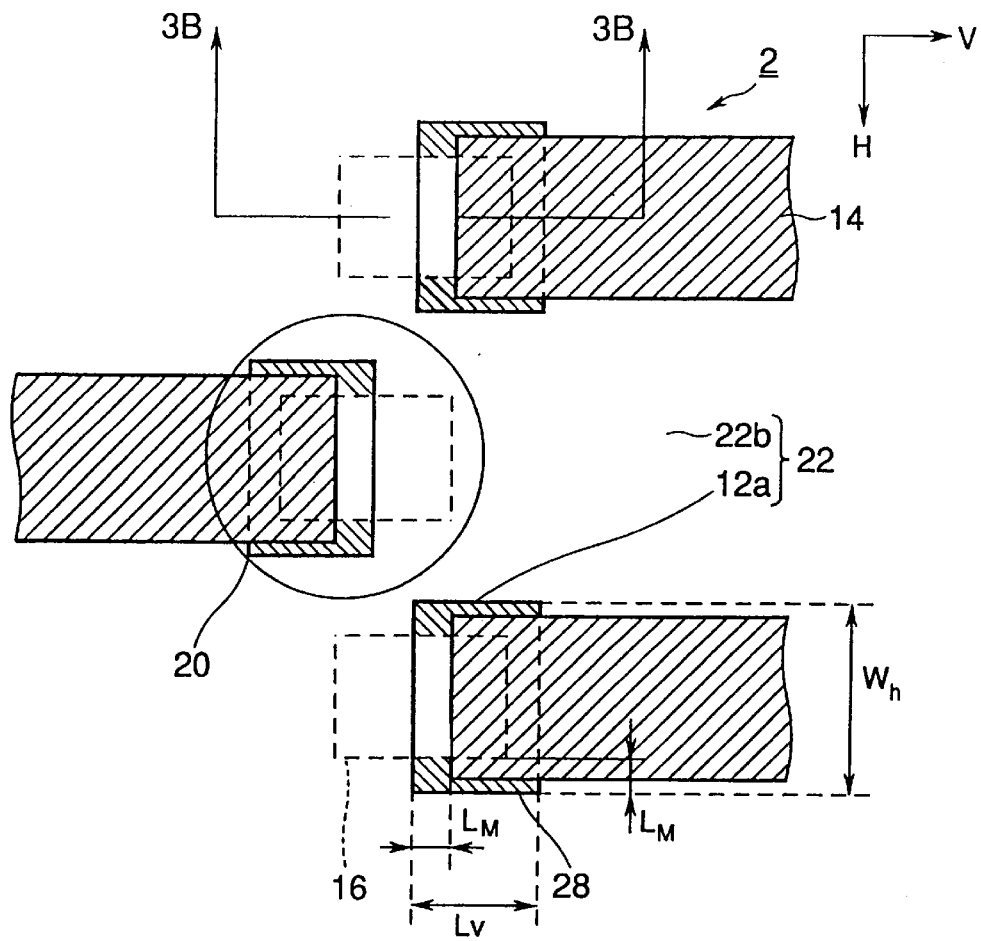
FIGS. 3A–3B illustrate a structure of an LED array according to a second embodiment, FIG. 3A being a top view and FIG. 3B being a cross-sectional view taken along lines 3B—3B of FIG. 3A.
Figure 3B:
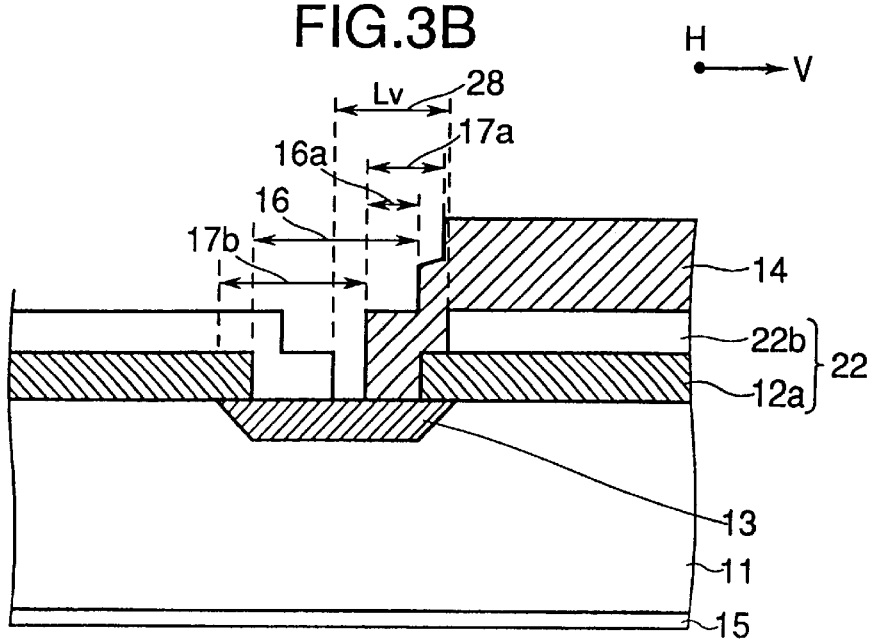

FIGS. 3A–3B illustrate a structure of an LED array according to a second embodiment. FIG. 3A is a top view and FIG. 3B is a cross-sectional view taken along lines 3B—3B of FIG. 3A. As shown in FIGS. 3A and 3B, the second embodiment differs from the first embodiment in that the second interlayer dielectric covers the first windows. Elements in FIGS. 3A–3B similar to those of FIGS. 1A–1B have been given the same reference numerals as those of FIGS. 1A–1B.

FIGS. 3A–3B illustrate an LED array 2 designed for a density of 1200 DPI. The LED array 2 includes N LEDs 20 aligned in a row on the n-type semiconductor substrate 11 at intervals corresponding to 1200 DPI.

With the LED array 2 of the second embodiment, a first interlayer dielectric 12a is formed on an n-type semiconductor substrate 11 and formed with first windows 16 therein in which individual LEDs 20 are formed. The LED array 2 further includes a second interlayer dielectric 22b having second windows 28 formed therein for individual LEDs 20, p-type diffusion region 13 formed in individual first windows 16, p-electrode 14 formed for individual p-type diffusion region 13, arid an n-electrode 15 common to all of the LEDs 20. The first interlayer dielectric 12a and second interlayer dielectric 22b form a multilayer interlayer dielectric 22. Since the first windows 16 and second windows 28 are arranged at predetermined intervals, the p-type diffusion regions 13 are also arranged at predetermined intervals on the semiconductor substrate 11. The second windows 28 are formed such that a connection 16a between the p-electrode 14 and the p-type diffusion region 13 is completely exposed through the second window 28. The second interlayer dielectric 22b is formed to overlap the first windows 16 to cover areas except for the connections 16a in the first windows 16. The second interlayer dielectric 22b is preferably formed of an insulation film such as SiN which is transparent to light and has a large refractive index. The SiN film has a refractive index of 1.9. The second window 28 is just large enough to expose the connection 16a, and therefore the second interlayer dielectric 22b covers most of the light-emitting area 17b.

The manufacturing processes of the LED array 2 will now be described. FIGS. 4A–4D illustrate an example of processes for fabricating the LED array 2. As shown in FIG. 4A, the first interlayer dielectric 12a is formed on the surface of the n-type semiconductor substrate 11 in the same way as the first embodiment previously described with reference to FIG. 2A. Then, the first windows 16 are formed in the first interlayer dielectric 12a and subsequently the p-type diffusion regions 13 are formed in the n-type semiconductor substrate 11 by Zn solid state diffusion in the same way as shown in FIGS. 2B and 2C.

Then, as shown in FIG. 4B, after the p-type diffusion region 13 has been formed on the n-type semiconductor substrate 11, the second interlayer dielectric 22b is formed. The second interlayer dielectric 22b is patterned by the photolithography and etching processes to form the second windows 28 therein. The second interlayer dielectric 22b is, for example, a film of silicon nitride (SiN) formed by the CVD process. The SiN film has a thickness of about 1000 angstroms.

The second windows are formed to completely expose the subsequently formed connections 16a but cover areas in which light is emitted. Therefore, the dimensions Wh and Lv of the second window 28 in the H and V directions, respectively, are selected such that the areas in which the connections 16a are to be formed are completely exposed even if masks are misaligned within predetermined errors during the photolithography process when forming the second windows 28. The second embodiment improves the yield of the LED array 2.

After the second windows 28 have been formed, the p-electrodes 14 are formed as shown in FIG. 4C on the n-type semiconductor substrate 11 in the same way as the first embodiment described with reference to FIG. 2E.

Then, as shown in FIG. 4D, the n-electrode 15 is formed on the entirety of the reverse side of the n-type semiconductor substrate 11 in the same way as shown in FIG. 2F. This completes the manufacture of the LED array 2.

Referring to FIGS. 3A and 3B, the dimensions Wh and Lv of the second windows 28 have margins $L_M$ such that the connections 16a are completely exposed through the second windows 28 even when the masks are misaligned within predetermined errors. These margins $L_M$ may be determined taking into account the alignment accuracy of the exposure tool used in the photolithography process. For example, when the maximum alignment error of the exposure tool is ±2 $\mu$m, the margin $L_M$ may be set to a value larger than 2 $\mu$m. Formed over the light-emitting area 17b is the second dielectric 22b having a high refractive index. The light is radiated more efficiently into air when emitted through a medium than when emitted directly into air, provided the medium has a larger refractive index than air. This is more prominent with increasing refractive index. Thus, covering the surface of the light-emitting area 17b with the second interlayer dielectric 22b improves radiation efficiency of the light.

Figure 5:
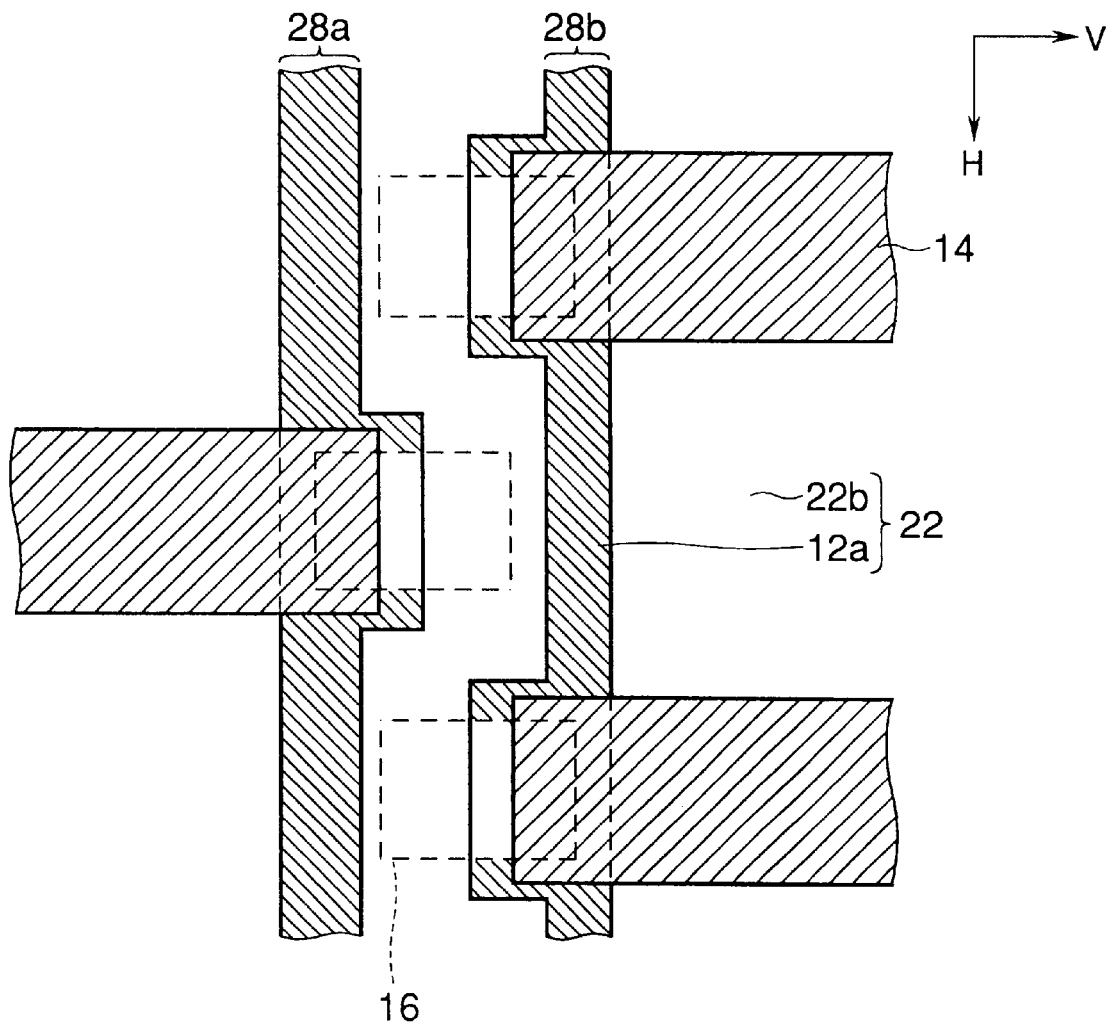
FIG. 5 is a top view of a modification of the LED array according to the second embodiment.

The shape of the second windows 28 is not limited to that shown in FIGS. 3A. The second windows 28 need not be formed individually for the first windows 16 and may be a single window similar to that in the first embodiment. In other words, the second window 28 only needs to be wide enough so that the connection 16a is completely exposed and the light-emitting area 17b is covered with the second interlayer dielectric 22b. FIG. 5 is a top view of a modification of the LED array according to the second embodiment. Referring to FIG. 5, second window 28a is common to one of two series of first windows and extends in the H direction, and a second window 28b is common to the other of the two series of first windows and extends in the H direction, the series of first windows being staggered with respect to each other. For example, one of the two series of first windows comprises even-numbered first windows and the other of the two series of first windows comprises odd-numbered first windows.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An LED array, comprising:

a first interlayer dielectric formed on a semiconductor substrate of a first conductivity type, said first interlayer dielectric having a plurality of first windows formed therein, said plurality of first windows being aligned substantially in a row, each of said first windows having a first perimeter;

a plurality of diffusion regions of a second conductivity type, each of said diffusion regions being formed in said semiconductor substrate by doping through a corresponding one of said first windows;

a second interlayer dielectric formed on said first interlayer dielectric, said second interlayer dielectric having a second window with a second perimeter within which said plurality of first windows are positioned, said second window being elongated in a direction of the row, the first perimeter of each of said first windows not extending to the second perimeter; and a plurality of electrodes, each of which is formed on said second interlayer dielectric and has an area extending beyond said second interlayer dielectric through said second window and a corresponding one of said first windows, said area being in electrical contact with a part of a corresponding one of said diffusion regions.

2. The LED array according to claim 1, wherein said first windows are aligned at intervals corresponding to a resolution of at least 1200 dots per inch.

3. The LED array according to claim 1, wherein said first windows are arranged in two series, said two series being staggered with respect to each other.

4. An LED array, comprising:

a first interlayer dielectric formed on a semiconductor substrate of a first conductivity type, said first interlayer dielectric having a plurality of first windows formed therein, said plurality of first windows being aligned substantially in a row;

a plurality of diffusion regions of a second conductivity type, each of said diffusion regions being formed in said semiconductor substrate by doping through a corresponding one of said first windows;

a second interlayer dielectric formed on said first interlayer dielectric, said second interlayer dielectric having a plurality of second windows, each of said second windows overlaps a corresponding one of said first windows so that said second interlayer dielectric covers a part of each of said first windows, each of said second windows having a perimeter; and a plurality of electrodes, each of which is formed on said second interlayer dielectric and has an area extending beyond said second interlayer dielectric through a corresponding one of said second windows and a corresponding one of said first windows, said area being in electrical contact with a part of a corresponding one of said diffusion regions, the area being within a corresponding one of said plurality of said second windows and not extending to the perimeter.

5. The LED array according to claim 4, wherein said second interlayer dielectric covers a substantial part of each of said first windows except for the area of each of said electrodes.

6. The LED array according to claim 4, wherein said second interlayer dielectric is formed of a material transparent to light, said second layer dielectric having a refractive index not less than 1.9.

7. The LED array according to claim 4, wherein said first windows are aligned at intervals corresponding to a resolution of at least 1200 dots per inch.

8. The LED Array according to claim 4, wherein said first windows are arranged in two series, said two series being staggered with respect to each other.

9. The LED array according to claim 8, wherein said plurality of second windows are aligned in two rows, each of said second windows in one of the two rows overlapping a corresponding one of said series of first windows and each of said second windows in the other of the two rows overlapping a corresponding one of said other series of first windows.

10. An LED array, comprising:
   a first interlayer dielectric formed on a semiconductor substrate of a first conductivity type, said first interlayer dielectric having a plurality of first windows formed therein, said plurality of first windows being aligned substantially in a row;
   a plurality of diffusion regions of a second conductivity type, each of said diffusion regions being formed in said semiconductor substrate by doping through a corresponding one of said first windows;
   a second interlayer dielectric formed on said first interlayer dielectric, said second interlayer dielectric having two openings elongated in a direction parallel to the row, each of said two elongated openings having a perimeter, one of said two elongated openings overlapping one series of first windows and the other of said two elongated openings overlapping another series of first windows; and
   a plurality of electrodes, each of which is formed on said second interlayer dielectric and having an area extending beyond said second interlayer dielectric through a corresponding one of said two elongated openings and a corresponding one of said series of first windows, said area being in electrical contact with a part of a corresponding one of said diffusion regions and not extending to the perimeter of each of said two elongated openings.

11. The LED array according to claim 10, wherein said second interlayer dielectric covers a substantial part of each of said first windows except for the area of each of said electrodes.

12. The LED array according to claim 10, wherein said second interlayer dielectric is formed of a material transparent to light, said second layer dielectric having a refractive index not less than 1.9.

13. The LED array according to claim 10, wherein said first windows are aligned at intervals corresponding to a resolution of at least 1200 dots per inch.

14. The LED Array according to claim 10, wherein said first windows are arranged in two series, said two series being staggered with respect to each other.

\* \* \* \* \*